United States Patent [19]

Avins et al.

[11] 3,961,361

[45] June 1, 1976

[54] GAIN CONTROL ARRANGEMENT USEFUL IN A TELEVISION SIGNAL PROCESSING SYSTEM

[75] Inventors: Jack Avins, Princeton; Bernard Joseph Yorkanis, South Plainfield, both of N.J.

[73] Assignee: RCA Corporation, New York, N.Y.

[22] Filed: May 23, 1975

[21] Appl. No.: 580,690

[52] U.S. Cl. .............................. 358/27; 178/7.5 DC; 330/29; 330/134
[51] Int. Cl.² .......................................... H04N 9/12
[58] Field of Search ........... 358/27, 39; 178/7.5 DC, 178/7.5 R, 7.3 R, 7.3 DC; 330/29, 134, 30 D

[56] References Cited
UNITED STATES PATENTS

| | | | |
|---|---|---|---|
| 3,374,310 | 3/1968 | Beers | 358/27 |
| 3,467,770 | 9/1969 | Voigt et al. | 358/27 |
| 3,715,463 | 2/1973 | Matzek | 358/27 X |
| 3,736,520 | 5/1973 | Acker | 330/134 X |
| 3,813,686 | 5/1974 | Mierzwinski | 358/27 |

*Primary Examiner*—Benedict V. Safourek
*Assistant Examiner*—Mitchell Saffian
*Attorney, Agent, or Firm*—Eugene M. Whitacre; Peter M. Emanuel

[57] ABSTRACT

In a color television receiver, first and second amplifiers are respectively included in the luminance and chrominance channels to permit control of contrast and saturation. The amplifiers have gain versus control voltage characteristics including linear portions extrapolated to cut off at predetermined voltages which may or may not be the same. A first potentiometer is coupled between a source of fixed voltage equal to the extrapolated cut off voltage of the first amplifier and a gain controlling voltage source. The gain controlling voltage may be produced by a circuit including an element responsive to ambient light. The wiper of the first potentiometer is coupled to the first amplifier to couple a voltage developed at a predetermined point of the first potentiometer to the first amplifier to control its gain. A second potentiometer is coupled between a source of voltage equal to the extrapolated cut off voltage of the second amplifier and the gain controlling voltage source to receive a portion of the gain controlling voltage in accordance with the ratio of the extrapolated cut off voltages of the first and second amplifiers. The wiper of the second potentiometer is coupled to the second amplifier to couple a voltage developed at a predetermined point of the second potentiometer to the second amplifier to control its gain. In this manner, the contrast of the receiver may be varied over a relatively wide range while saturation is maintained substantially constant.

11 Claims, 7 Drawing Figures

GAIN CONTROL ARRANGEMENT USEFUL IN A TELEVISION SIGNAL PROCESSING SYSTEM

The present invention pertains to gain controlling apparatus and particularly to apparatus for controlling the gains of amplifiers included in the luminance and chrominance channels of a television signal processing system.

Recently, the maximum brightness available from television receivers has increased sufficiently so that a pleasing image may be reproduced under conditions of high ambient light as well as under conditions of low ambient light. Apparatus is known for automatically controlling the contrast and brightness properties of a television receiver in response to ambient light to provide a pleasing image over a range of ambient light conditions. Such apparatus is described in U.S. Pat. Nos. 3,027,421, entitled "Circuit Arrangements For Automatically Adjusting The Brightness And The Contrast In A Television Receiver," issued to H. Heijligers on Mar. 27, 1962 and 3,025,345, entitled "Circuit Arrangement For Automatic Readjustment Of The Background Brightness And The Contrast In A Television Receiver," issued to R. Suhrmann on Mar. 13, 1962.

Apparatus is also known for automatically controlling the contrast and saturation properties of a color television receiver by controlling the gains of luminance and chrominance channel amplifiers, respectively, in response to ambient light. Such apparatus is described in U.S. Pat. Nos. 3,813,686 entitled "Ambient Light Responsive Control Of Brightness, Contrast And Color Saturation," issued to Eugene Peter Mierzwinski, on May 28, 1974 and 3,814,852 entitled "Ambient Light Responsive Control Of Brightness, Contrast and Color Saturation," issued to Eugene P. Mierzwinski on June 4, 1974.

Also of interest is apparatus for manually controlling the gains of luminance and chrominance channel amplifiers. Such apparatus is described in U.S. Pat. Nos. 3,374,310, entitled "Color Television Receiver with Simultaneous Brightness and Color Saturation Controls," issued to G.L. Beers on Mar. 19, 1968; 3,467,770, entitled "Dual Channel Automatic Control Circuit," issued to DuMonte O. Voigt on June 7, 1966; and 3,715,463, entitled "Tracking Control Circuits Using a Common Potentiometer," issued to Lester Tucker Matzek, on Feb. 6, 1973.

When the gain of luminance channel is adjusted to control the contrast of an image, either manually or automatically, in response to ambient light, it is desirable to simultaneously control the gain of the chrominance channel in such a manner that the ratio of the gains of the luminance and chrominance channels is substantially constant over a wide range of contrast control to maintain constant saturation. If the proper ratio between the amplitudes of the chrominance and luminance signals is not maintained incorrect color reproduction may result. For instance, if the amplitude of the luminance signals are increased without correspondingly increasing the amplitude of the chrominance signals, colors may become desaturated, i.e., they will appear washed out or pastel in shade. Furthermore, it may be desirable to provide controls for presetting the gains of the luminance and chrominance channels to compensate for tolerance variations in other portions of the television signal processing apparatus.

In accordance with the present invention, apparatus is provided which may be utilized in a color television receiver to control contrast over a relatively wide range while maintaining constant saturation. The apparatus includes first and second amplifiers having gain versus control voltage characteristics including linear portions extrapolated to cut off at predetermined voltages which may or may not be the same. Means couple a gain controlling voltage source to the first amplifier to control its gain. Potentiometer means are coupled between a source of fixed voltage substantially equal to the extrapolated cut off voltage of the second amplifier and the source of gain controlling voltage to receive a portion of said gain controlling voltage in accordance with the ratio of the extrapolated cut off voltages of the amplifiers. A voltage developed at a predetermined point along the potentiometer means is coupled to the second amplifier to control its gain.

In accordance with another feature of the present invention, the means for coupling said gain controlling voltage to said first amplifier includes another potentiometer coupled between a source of fixed voltage substantially equal to the extrapolated cut off voltage of said first amplifier and said gain controlling voltage source.

In accordance with still another feature of the present invention the gain controlling voltage source includes an element responsive to ambient light.

These and other aspects of the present invention may best be understood by references to the following detailed description and accompanying drawing in which:

Figure 1:
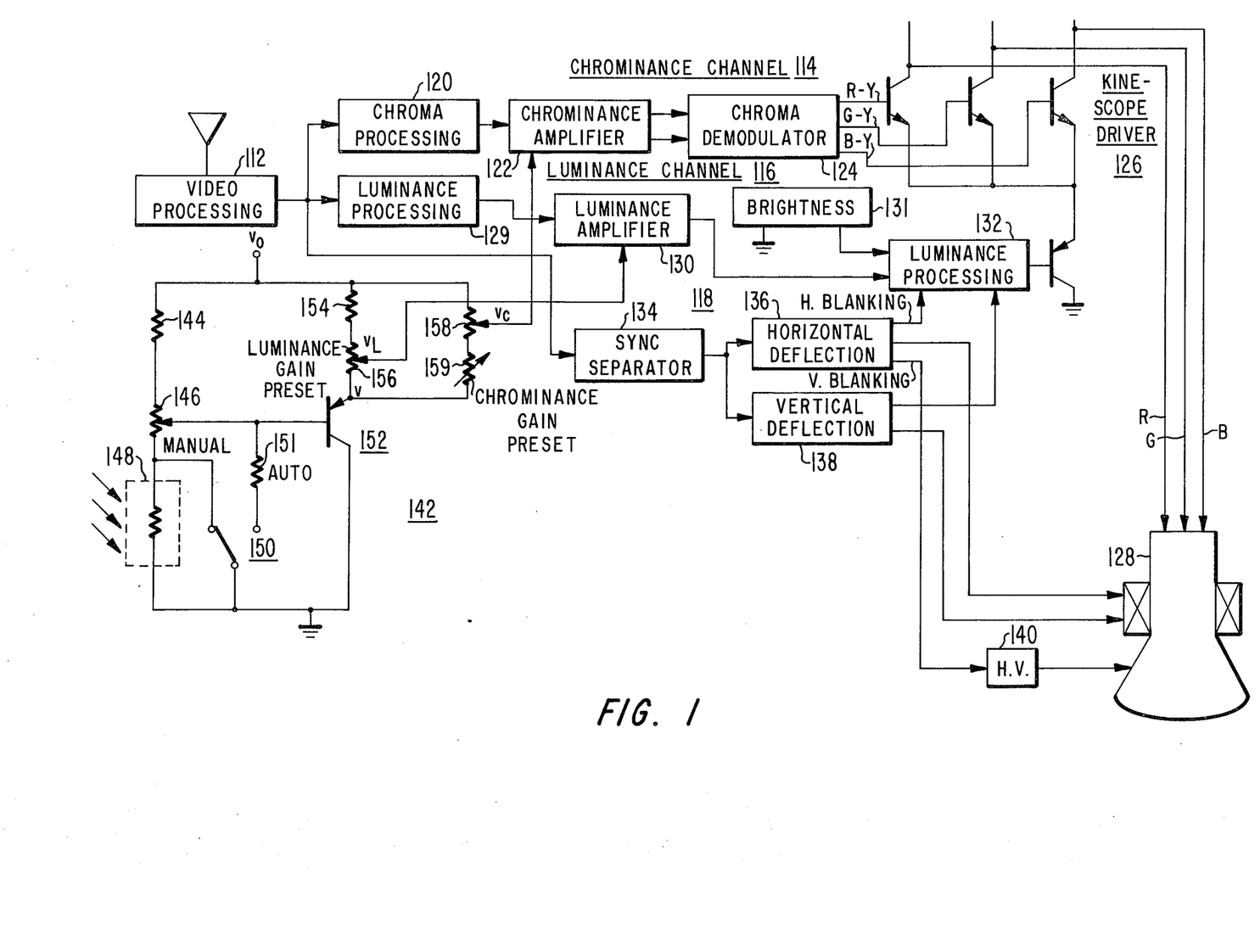
FIG. 1 shows the general arrangement, partly in block diagram form and partly in schematic diagram form, of a color television receiver employing an embodiment of the present invention.

Referring now to FIG. 1, the general arrangement of a color television receiver employing the present invention includes a video signal processing unit 112 responsive to radio frequency (RF) television signals for generating, by means of suitable intermediate frequency (IF) circuits (not shown) and detection circuits (not shown), a composite video signal comprising chrominance, luminance, sound and synchronizing signals. The output of signal processing unit 112 is coupled to chrominance channel 114, luminance channel 116, a channel 118 for processing the synchronizing signals and a channel (not shown) for processing sound signals.

Chrominance processing channel 114 includes chrominance processing unit 120 which serves to remove chrominance signals from the composite video signal and otherwise process chrominance signals. Chrominance signal processing unit 120 may include, for example, automatic color control (ACC) circuits for adjusting the amplitude of the chrominance channels in response to amplitude variations of a reference signals, such as a color burst signal, included in the commposite video signal. Chrominance signal processing circuits of the type described in the U.S. Pat. No. 3,740,462, entitled "Automatic Chroma Gain Control System," issued to L.A. Harwood, on June 19, 1973 and assigned to the same assignee as the present invention are suitable for use as chrominance processing unit 120.

The output of the chrominance signal processing unit 120 is coupled to chrominance amplifier 122 which serves to amplify chrominance signals in response to a DC signal $v_c$ generated by gain control network 142. As illustrated, chrominance amplifier 122 provides chrominance signals to a chroma demodulator 124. An amplifier suitable for use as chrominance amplifier 122 will subsequently be described with reference to FIG. 6.

Chroma demodulator 124 derives color difference signals representing, for example, R—Y, B—Y and G—Y information from the chrominance signals. Demodulator circuits of the general type illustrated by the chrominance amplifier CA 3067 integrated circuit manufactured by RCA Corporation are suitable for use as chrominance demodulator 124.

The color difference signals are applied to a video driver 126 where they are combined with the output signals —Y of luminance channel 116 to produce color signals of the appropriate polarity, representing for example, red (R), green (G) and blue (B) information. The color signals are coupled to kinescope 128.

Luminance channel 116 includes a first luminance signal processing unit 129 which relatively attenuates undesirable signals, such as chrominance or sound signals or both, present in luminance channel 116 and otherwise processes the luminance signals. The output of first luminance processing unit 129 is coupled to luminance amplifier 130 which serves to amplify the luminance signals in response to a DC control signal $v_L$ generated by gain control unit 142 to thereby determine the contrast of a reproduced image. An amplifier suitable for use as luminance amplifier 130 will subsequently be described with reference to FIG. 5. The output of luminance amplifier 130 is coupled to second luminance signal processing unit 132 which serves to further process luminance signals. A brightness control unit 131 is coupled to luminance signal processing unit 132 to control the DC content of the luminance signals. The output —Y of luminance processing unit 132 is coupled to kinescope driver 126.

Channel 118 includes a sync separator 134 which separates horizontal and vertical synchronizing pulses from the composite video signal. The synchronizing pulses are coupled to horizontal deflection circuit 136 and vertical deflection circuit 138. Horizontal deflection circuit 136 and vertical deflection circuit 138 are coupled to kinescope 128 and to a high voltage unit 140 to control the generation and deflection of one or more electron beams generated by kinescope 128 in the conventional manner. Deflection circuits 136 and 138 also generate horizontal and vertical blanking signals which are coupled to luminance signal processing unit 132 to inhibit its operation during the horizontal and vertical retrace intervals.

Gain control unit 142 is coupled to luminance amplifier 130 and to chrominance amplifier 122 to control their gains. Gain control unit 142 includes a PNP transistor 152 arranged as an emitter-follower amplifier. The collector of transistor 152 is coupled to ground while its emitter is coupled through a series connection of a potentiometer 156 and fixed resistor 154 to a source of positive supply voltage $V_O$. The wiper of potentiometer 156 is coupled to luminance amplifier 130. The series connection of a potentiometer 158 and a variable resistor 159 is coupled between the source of positive supply voltage $V_O$ and the emitter of transistor 152. The wiper of potentiometer 158 is coupled to chrominance amplifier 122.

The base of transistor 152 is coupled to the wiper of a potentiometer 146. One end of potentiometer 146 is coupled to the source of positive supply voltage $V_O$ through a fixed resistor 144. The other end of potentionmeter 146 is coupled to ground through a light dependent resistor (LDR) 148. LDR 148 is a resistance element whose impedance varies in inverse relationship with light which impinges on it. LDR 148 may comprise a simple cadmium sulfide type of light dependent element or other suitable light dependent device. LDR 148 is desirably mounted to receive ambient light in the vicinity of the screen of kinescope 128.

A single pole double-throw switch 150 has a pole coupled to the junction of potentiometer 146 and LDR 148. A resistor 151 is coupled between the wiper of potentiometer 146 and the other pole of switch 150. The arm of switch 150 is coupled to ground.

The general arrangement shown in FIG. 1 is suitable for use in a color television receiver of the type shown, for example, in *RCA Color Television Service Data* 1973 *No. C-8 for a CTC-*68 type receiver, published by RCA Corporation, Indianapolis, Indiana.

In operation, gain control circuit 142 maintains the ratio of the gain of chrominance amplifier 122 to the gain of amplifier 130 constant in order to maintain constant saturation while providing for contrast adjustment either manually by means of potentiometer 146 or automatically by means of LDR 148. If the gain of luminance were adjusted to control the contrast of an image without a corresponding change in the gain of chrominance amplifier 122, the amplitudes of luminance signals —Y and color difference signals R—Y, B—Y and G—Y would not, in general, be in the correct ratio when combined by divider 126 to provide the desired color.

When switch 140 is in the MANUAL position, the gains of chrominance amplifier 122 and luminance amplifier 130 are controlled by adjustment of the position of potentiometer 146. When switch 150 is in the AUTO position the gain of the chrominance amplifier 122 and luminance amplifier is automatically controlled by the response of LDR 148 to ambient light conditions. The voltage developed at the wiper of potentiometer 146 (base of transistor 152) when switch 150 is in the AUTO position is inversely related to the ambient light recieved by LDR 148. It is noted that the values of resistors 114, potentiometer 146, LDR 148 and resistor 151 are desirably selected such that the adjustment of the wiper arm of potentiometer 146 when switch 150 is in the MANUAL position does not substantially affect the voltage developed at the base of transister 152 when switch 150 is placed in the AUTO position.

The control voltage v developed at the wiper arm of potentiometer 146 is coupled through emitter-follower transistor 152 to the common junction of potentiometer 156 and variable resistor 159. A control voltage $v_L$ comprising v plus a predetermined portion of the difference $V_O-v$ developed across the series connection of fixed resistor 154 and potentiometer 156, depending on the setting of potentiometer 156, is coupled to luminance amplifier 130 to control its gain. Similarly, a control voltage $v_C$ comprising v plus a predetermined portion of the difference voltage $V_O-v$ developed across the series connection of potentiometer resistor 158 and variable resistor 159, depending on the setting of the wiper of potentiometer 158, is coupled to chrominance amplifier 122 to control its gain.

The gain of luminance amplifier 130 may be pre-set to a desired value by the factory adjustment of potentiometer 156. Similarly, variable resistor 159 is provided to allow factory pre-set of the gain of the chrominance amplifier 122. Potentiometer 158 is provided to allow customer control of saturation.

Figure 2:
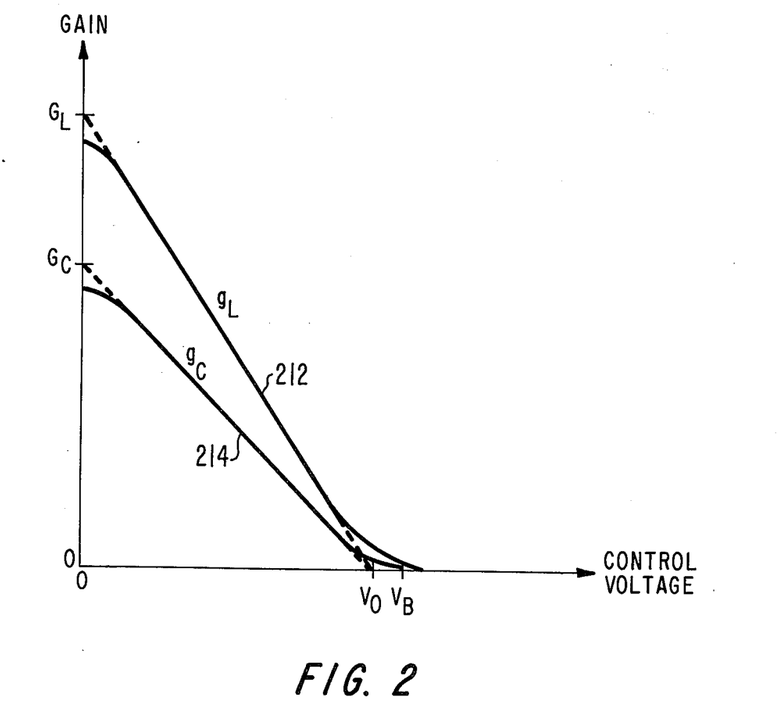
FIG. 2 shows graphical representation of gain versus control voltage characteristics of amplifiers utilized in the embodiment shown in FIG. 1.

Referring to FIG. 2, the gain versus voltage characteristics of chroma amplifier 122 ($g_C$) and luminance amplifier 130 ($g_L$) are shown. The characteristic $g_C$ has a reversed S-shape including a linear portion 214. Extrapolated linear portion 214 of $g_C$ intersects the GAIN axis at $G_C$ and intersects the CONTROL VOLTAGE axis at $V_O$. Similarly, the characteristics $g_L$ has a reverse S-shape characteristic including a linear portion 212. Extrapolated linear portion 214 of $g_L$ intersects the GAIN axis at $G_L$ and intersects the CONTROL VOLTAGE axis at $V_O$.

From FIG. 2, the expression for linear portion 212 of $g_L$ is $$g_L = - \frac{G_L}{V_o} v_L + G_L \qquad [1]$$

The expression for linear portion 214 of $g_C$ is $$g_C = - \frac{G_C}{V_o} v_C + G_C \qquad [2]$$

From FIG. 1, the expression for $v_L$ is $$v_L = v + (V_o-v) K_1 \qquad [3]$$

where $K_1$ is determined by the voltage division of fixed resistor 154 and potentiometer 156 at the wiper of potentiometer 156. When the wiper of potentiometer 156 is at the emitter of transistor 152, $K_1=0$. The expression for $v_C$ is $$v_C = v + (V_o-v)K_2 \qquad [4]$$

where $K_2$ is determined by the voltage division of potentiometer 158 and fixed resistor 159 at the wiper of potentiometer 158. By combining equations [1] and [3], the equation for $g_L$ becomes $$g_L = - \frac{G_L}{V_o} [v+(V_o-v)K_1] + G_L \qquad [5]$$

By combining equations [2] and [4], the equation for $g_C$ becomes $$g_C = - \frac{G_C}{V_o} [v+(V_o-v)K_2] + G_C \qquad [6]$$

The ratio of $g_L$ to $g_C$ is thus $$\frac{g_L}{g_C} = \frac{G_L(1-K_1)}{G_C(1-K_2)} \qquad [7]$$

It is noted that this ratio is independent of DC control voltage v. Thus, although DC control voltage v may be varied either manually or in response to ambient light to control the contrast of an image reproduced by kinescope 128, the saturation remains constant.

With reference to FIG. 2, it is noted that although the linear portion 214 of $g_C$ has an extrapolated gain equal to 0 at a control voltage equal to $V_O$, the non-linear portion of $g_C$ does not attain a gain equal to 0 until a control voltage equal to $V_B$. That is, a control voltage of $V_O$ will not cut-off chrominance amplifier 122.

Figure 1A:
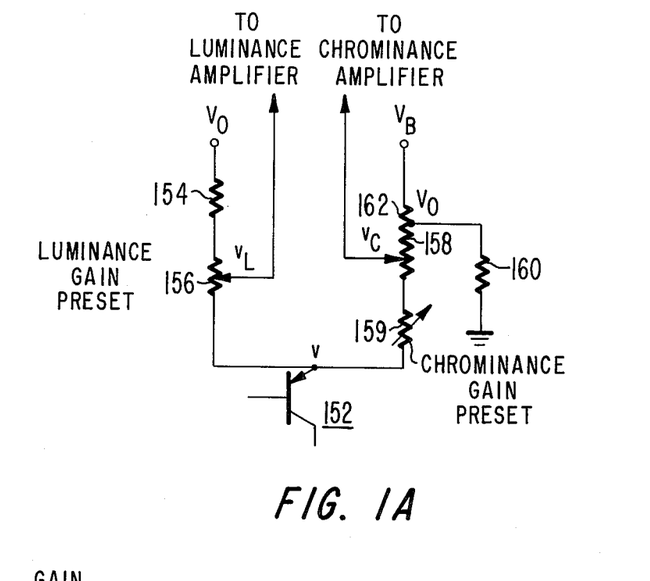
FIG. 1A shows, in schematic form, a modification to the embodiment shown in FIG. 1.

In FIG. 1A there is shown, in schematic form, a modification to the arrangement of gain control network 142 of FIG. 1 with provisions which allow a viewer to cut off chrominance amplifier 122 to produce a more pleasing image under conditions of poor color reception due, for example, to noise or interference. The modifications to gain control unit 142 shown in FIG. 1A include coupling potentiometer resistor 158 between a source of positive supply voltage $V_B$, the value of $V_B$ being greater than the value of $V_O$, and coupling a resistor 160 from a tap-off point 162 along potentiometer 158 to ground. The value of potentiometer 158 and resistor 160 and the location of tap 162 are selected so that voltage $V_O$ is developed at tap 162.

The arrangement shown in FIG. 1A allows for the adjustment of contrast while constant saturation is maintained and additionally allows a viewer, by adjusting the wiper of potentiometer 158 to voltage $V_B$, to cut off chrominance amplifier 122.

Figure 3:
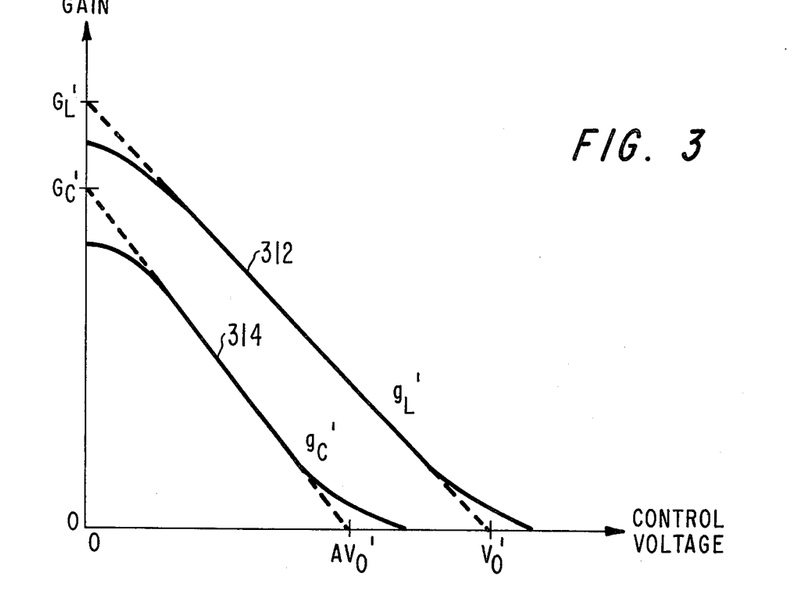
FIG. 3 shows graphical representations of gain versus control voltage characteristics of amplifiers which may be utilized in the receiver shown in FIG. 1.

Referring to FIG. 3 there are shown gain versus DC control voltage characteristics of chrominance and luminance amplifiers which do not have the same extrapolated linear cut off control voltage. The gain versus control voltage characteristic $g_L'$ of the luminance amplifier has a reverse S-shape characteristic including a linear portion 312. Extrapolated linear portion 312 of $g_L'$ intersects the GAIN axis at a gain $G_L'$ and intersects the CONTROL VOLTAGE axis at a voltage $V_O'$. The gain versus control voltage characteristic $g_C'$ of the chrominance amplifier has a reverse S-shape characteristic having a linear portion 314. Extrapolated linear portion 314 of $g_C'$ intersects the GAIN axis at a gain $G_C'$ and intersects the CONTROL VOLTAGE axis at a voltage $AV_O'$, where A is a number greater than zero.

From FIG. 3, the expression for linear portion 312 of $g_L'$ is $$g_L' = - \frac{G_L'}{V_o'} v_L' + G_L' \qquad [8]$$

where $v_L'$ is the DC conrol voltage coupled to the luminance amplifier. The expression for linear portion 314 of $g_C'$ is $$g_C' = - \frac{G_C'}{AV_o'} v_C' + G_C' \qquad [9]$$

where $v_c{'}$ is the DC control voltage coupled to the chrominance amplifier.

Figure 4:
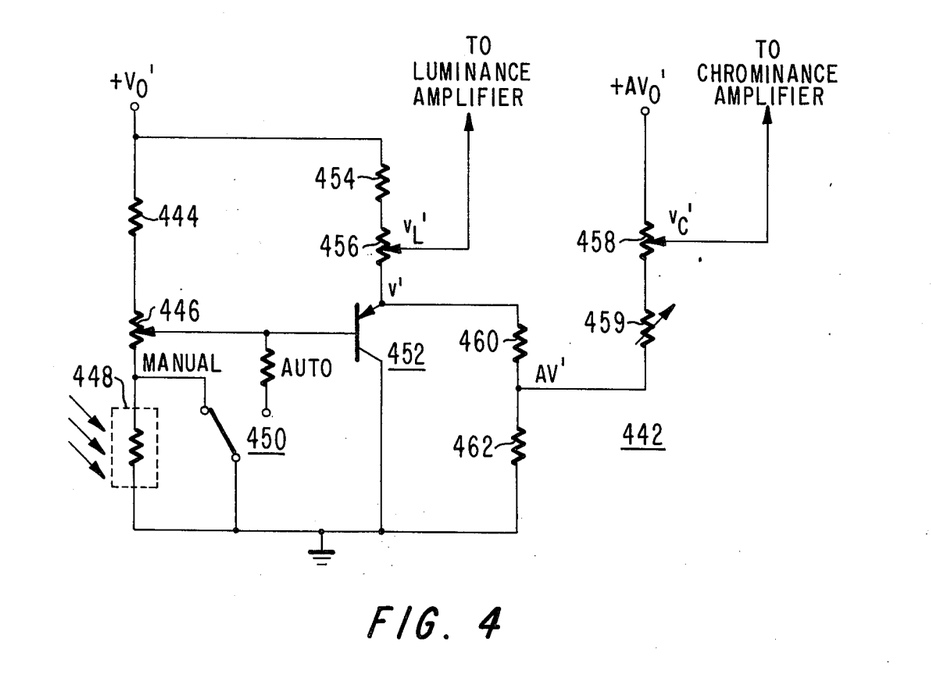
FIG. 4 shows, in schematic form, another embodiment of the present invention which may be utilized to control the amplifiers whose gain versus control voltage characteristics are shown in FIG. 3.

A modified form of the control network 142 of FIG. 1 suitable for controlling the gain of a chrominance and a luminance amplifier having characteristics such as shown in FIG. 3 is shown in FIG. 4. Similar portions of FIGS. 1 and 4 are identified by reference numbers having the same last two significant digits and primed (') designations. The modified portions of FIG. 1 shown in FIG. 4 include the series connection resistors 460 and 462 coupled between the emitter of transistor 452 to ground. The values of resistors 460 and 462 are selected so that a portion $Av'$ of the DC control voltage $v'$ developed at the emitter of transistor 452 is developed at the junction of resistors 460 and 462. Furthermore, the series connection of potentiometer 458 and variable resistor 459 is coupled between the junction of resistor 460 and 462 and a source of positive supply voltage $AV_o{'}$.

From FIG. 4, the expression for control voltage $v_L{'}$ developed at the wiper of potentiometer 456 is $$v_L{'} = v' + (v_o{'} - v')K_1{'} \qquad [10]$$

where $K_1{'}$ is determined by the voltage division at the wiper of potentiometer 456. The expression for control voltage $v_c{'}$ developed at the wiper of potentiometer 458 is $$V_c{'} = Av' + (AV_o{'} - Av')K_2{'} \qquad [11]$$

where $K_2{'}$ is determined by the voltage division at the wiper of potentiometer 458. By combining equations [8] and [10], $$g_L{'} = -\frac{G_L{'}}{V_o{'}}[v' + (V_o{'} - v')K_1{'}] + G_L{'} \qquad [12]$$

By combining equations [9] and [11], $$g_c{'} = -\frac{G_c{'}}{AV_o{'}}A[v' + (V_o{'} - v')K_2{'}] + G_c{'} \qquad [13]$$

The ratio of $g_L{'}$ to $g_c{'}$ is given by the expression $$\frac{g_L{'}}{g_c{'}} = \frac{G_L{'}}{G_c{'}}\frac{(1-K_1{'})}{(1-K_2{'})} \qquad [14]$$

It is noted that this ratio is independent of DC control voltage $v'$. Therefore, gain control network 442 of FIG. 4 also allows for the adjustment of contrast while maintaining constant saturation.

It is noted that if A were made equal to 1, the arrangement gain control unit 442 would be suitable to control the gains of chrominance and luminance amplifiers having the characteristics shown in FIG. 2.

Figure 5:
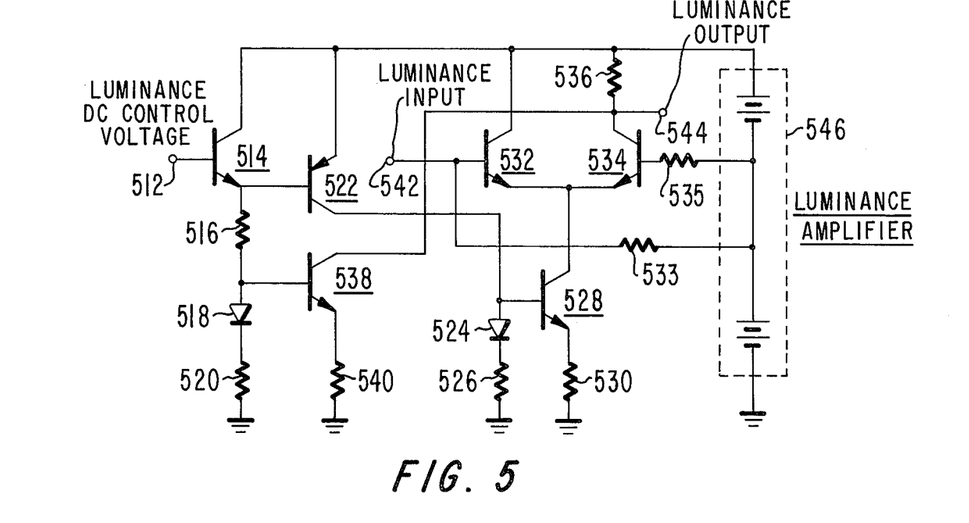
FIG. 5 shows, in schematic form, an amplifier which may be utilized in the receiver shown in FIG. 1.

In FIG. 5, there is shown an amplifier suitable for use as luminance amplifier 130 of FIG. 1. The amplifier includes a differential amplifier comprising NPN transistors 532 and 534. The commonly coupled emitters of transistors 532 and 534 are coupled to the collector of an NPN transistor 528. The emitter of transistor 528 is coupled via a resistor 530 to ground. The collector of transistor 532 and the collector of transistor 534, via load resistor 536, is coupled to a bias voltage provided by bias supply 546, illustrated as a series connection of batteries. The bases of transistors 532 and 534 are respectively coupled to a lower bias voltage through resistors 533 and 535 respectively.

An input signal, such as, for example, the output signal provided by first luminance processing circuit 129 of FIG. 1 is coupled to the base of transistor 532 via terminal 542. The output signal of the amplifier is developed at the collector of transistor 534 and coupled to output terminal 544.

A DC control voltage, such as $v_L$ provided by gain control unit 142 of FIG. 1, is coupled to the base of an NPN transistor 514, arranged as an emitter-follower, via terminal 512. The collector of transistor 514 is coupled to bias supply 546. The emitter of transistor 514 is coupled to ground through the series connection of resistor 516, a diode connected transistor 518 and resistor 520.

The anode of diode 520 is coupled to the base of an NPN transistor 538. The collector of transistor 538 is coupled to the collector of transistor 534 while its emitter is coupled to ground through resistor 540. Transistor 538, resistor 540, diode 518 and resistor 520 are arranged in a current mirror configuration.

The emitter of transistor 514 is coupled to the base of a PNP transistor 522. The emitter of transistor 522 is coupled to bias supply 546 while its collector is coupled to the base of transistor 528 and to ground through the series connection of a diode connected transistor 524 and resistor 526. Transistor 528, resistor 530, diode 524 and resistor 526 are arranged in a current mirror configuration In operation, the DC control voltage coupled to terminal 512 is coupled in inverted fashion to the anode of diode 524 by transistor 522. As a result, current directly related to the voltage developed at the anode of diode 524 flows through diode 524 and resistor 526. Due to the operation of the current mirror arrangement of diode 524, resistor 526, transistor 528 and resistor 530, a similar current flows through the emitter circuit of transistor 528. The gain of the differential amplifier comprising transistors 532 and 534 is directly related to this current flowing in the emitter circuit of transistor 528, and therefore is inversely related to the DC control voltage at terminal 512. The gain versus DC control voltage characteristics of the differential is similar to $g_L$ shown in FIG. 2.

Further, a current is developed through the series connection of resistor 516, diode 518 and resistor 520 in direct relationship to the DC control coupled to terminal 512. A similar current is developed through resistor 540 due to the operation of the current mirror comprising diode 518, resistor 520, transistor 538 and resistor 540. This current is of the opposite sense to that provided by the current mirror arrangement of diode 524, resistor 526, transistor 528 and resistor 530 and is coupled to the collector of transistor 534 so that the DC voltage at output terminal 544 does not substantially vary with the DC control voltage.

Figure 6:
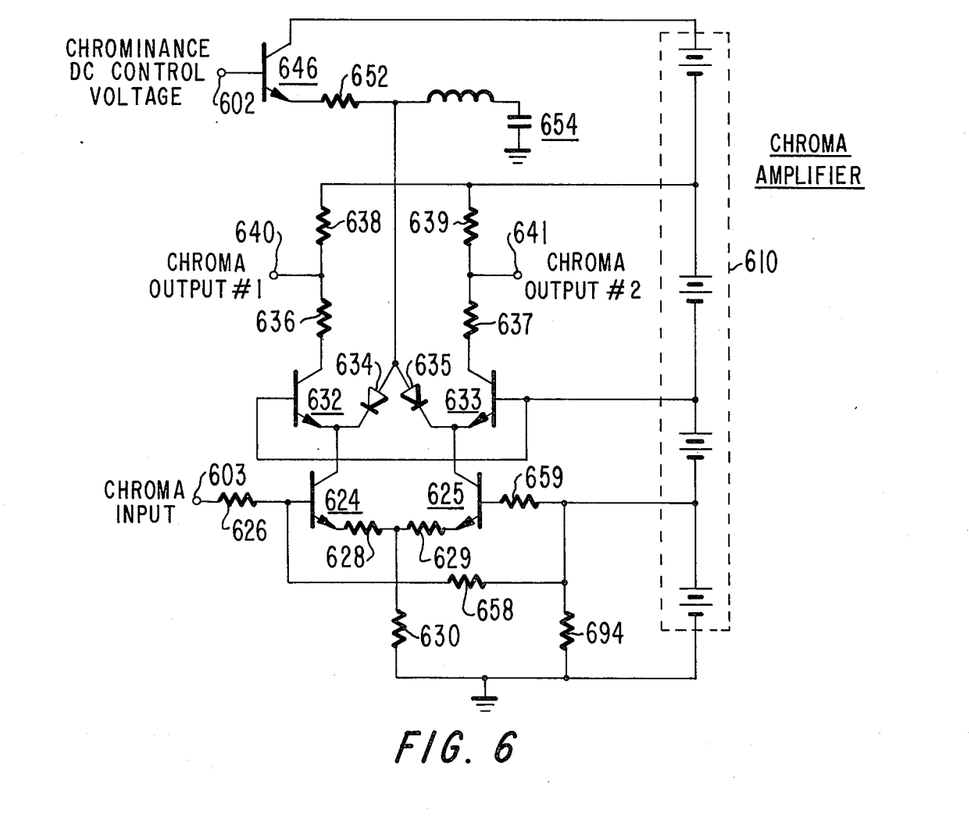
FIG. 6 shows, in schematic form, another amplifier which may be utilized in the receiver shown in FIG. 1.

In FIG. 6, there is shown an amplifier suitable for use as chroma amplifier 120 of FIG. 1. The amplifier shown in FIG. 6 is of the type described in U.S. patent application Ser. No. 530,405 entitled "Controllable Gain Signal Amplifier," fled by L.A. Harwood et al. on Dec. 6, 1974.

The amplifier comprises a differential amplifier including NPN transistors 624 and 625 having their bases coupled to terminal 603 via a resistor 626. Chrominance signals, provided by a source of chrominance signals such as chrominance processing unit 120 of FIG. 1, are coupled to terminal 603. The current conduction paths between the collectors and emitters of transistors 624 and 625 are respectively coupled to ground via resistors 628, 629 and 630.

A current splitter circuit comprising an NPN transistor 632 and a diode 634 is coupled to the collector of transistor 624. Diode 634 and the base-emitter junction of transistor 632 are poled in the same direction with respect to the flow of collector current in transistor 624. It desirable that conduction characteristics of transistor 632 and diode 635 be substantially matched. Similarly, the collector of transistor 625 is coupled to a second current splitter comprising a transistor 633 and a diode 635.

An output load circuit comprising series connected resistors 636 and 638 is coupled between the collector of transistor 632 and a source of operating voltage provided by bias supply 610. Amplified chrominance signals are provided at output terminal 640 for coupling, for example, to a chroma demodulator such as chroma demodulator 124 of FIG. 1. Similarly, series connected load resistors 637 and 639 are coupled between the collector of transistor 633 and bias supply 610. An output terminal 641 at the junction of resistors 637 ad 639 provides oppositely phased chrominance signals to those provided at terminal 640. The gain associated with the cascode combination of transistors 624 and 632 is controlled in response to a DC control voltage, such as, for example, $v_C$ provided by gain control unit 142 of FIG. 1, coupled to the base of an NPN transistor 646 via terminal 602. Direct control current is supplied from the emitter of transistor 646 to diode 634 and 635 via a series resistor 652. A signal by-pass circuit comprising a series resonant combination 654 of inductance and capacitance is coupled from the anode of diode 634 to ground. Resonant circuit 654 is tuned, for example, to 3.58 MHz to provide a low impedance path to ground for color subcarrier signals.

Bias voltages and currents are supplied to the amplifier arrangement by bias supply 610, illustrated as a series connection of batterys. A voltage B+ is coupled to the collector of transistor 646. A lower bias voltage is coupled to the load circuits of transistors 632 and 633. The bases of transistors 632 and 633 are coupled in common to a still lower bias voltage. The bases of transistors 624 and 625 are coupled to a still lower bias voltage via substantially equal in value resistors 658 and 659. A resistor 694 is coupled from the common junction of resistors 658 and 659 to ground.

In operation, a quiescent operating current is provided through resistor 630. In the absence of an input signal at terminal 603, this current will divide substantially equally between the similarly biased transistors 624 and 625. If the DC control voltage at terminal 602 is near ground potential, transistor 646 will be effectively cut off and no current will flow in resistor 652 and diodes 634 and 635. In that case, neglecting the normally small difference betweeen collector and emitter currents of NPN transistors, the collector currents of transistors 624 and 625 will flow, respectively, in transistors 632 and 633. The transistors 632 and 633 are operated in common base mode and form cascode signal amplifiers with respective transistors 624 and 625. With the DC control voltage near ground potential, one-half of the quiescent current from resistor 630 flows in each of the load circuits and maximum gain for chrominance signals supplied from terminal 603 is provided.

Transistor 646 will conduct when the DC control voltage approaches the bias voltage supplied to the bases of transistors 632 and 633 of the current splitters. By selection of the circuit parameters, diodes 634 and 635 may be arranged to operate in a range between cut off to the conduction of all of the quiescent operating current supplied via resistor 630, thereby cutting off transistors 632 and 633 to provide no output signals at terminals 640 and 641.

At a DC control voltage intermediate to that corresponding to cut off of transistors 632 and 633 on the one hand and cut off of diodes 634 and 635 on the other hand, the voltage gain of the illustrated amplifier will vary in a substantially linear manner with the DC control voltage.

It is noted that although the characteristics shown in FIGS. 2 and 3 were reversed S-shaped characteristics, the characteristics could have other shapes including linear portions. For example, the characteristics could be substantially linear. Furthermore, with reference to FIG. 3, although $g_C'$ was shown as having a linear portion that had a cut off control voltage lower than the cut off control voltage of the linear portion of $g_L'$, the cut off control voltage of the linear portion of $g_C'$ could be greater than the cut off voltage for the linear region of $g_L'$. In addition, the gain control units and associate amplifiers could be arranged to utilize voltages opposite in polarity to those shown. These and other modifications are intended to be within the scope of the invention.

What is claimed is:

1. In a color television signal processing system of the type including luminance and chrominance signal processing channels, apparatus comprising:
   first and second amplifiers respectively included in said luminance and chrominance channels, said amplifiers having gain versus control voltage characteristics including linear portions extrapolated to cut-off at predetermined voltages which may or may not be the same voltage;
   a gain controlling voltage source;
   means for coupling said gain controlling voltage to said first amplifier to control its gain;
   potentiometer means coupled between a fixed voltage substantially equal to the extrapolated cut-off voltage of said second amplifier and to said gain controlling voltage source to recieve a portion of said gain controlling voltage in accordance with the ratio of the extrapolated cut-off voltages of said first and second amplifiers; and
   means for coupling a voltage developed at a predetermined point on said potentiometer means to said second amplifier to control its gain.

2. The apparatus recited in claim 1 wherein said means for coupling said gain controlling voltage to said first amplifier includes another potentiometer coupled between a source of fixed voltage substantially equal to the extrapolated cut-off voltage of said first amplifier and said gain controlling voltage source.

3. In a color television signal processing system of the type including luminance and chrominance signal processing channels, apparatus comprising:
   first and second amplifiers respectively included in said luminance and chrominance channels, said amplifiers having gain control voltage characteristics including linear portions extrapolated to cut-off at substantially the same predetermined voltage;

a source of gain controlling voltage; and
means for coupling said gain controlling voltage to said first and second amplifiers.

4. Apparatus comprising:
first variable gain amplifying means for amplifying a first signal in response to a first DC control signal, said first amplifying means having a first gain versus DC control voltage characteristic including a linear region, said linear region having a gain substantially equal to 0 at a DC control voltage equal to $V_O$;
second variable gain amplifying means for amplifying a second signal in response to a second DC control signal, said second amplifying means having a second gain versus DC control voltage characteristic including a linear region, said linear region having a gain substantially equal to 0 at a DC control voltage equal to $AV_O$, where A is a number greater than 0;
a first source of fixed voltage substantially equal to $V_O$;
a second source of fixed voltage substantially equal to $AV_O$;
means for developing a third DC control voltage $v$;
means for developing a portion $Av$ of said third control voltage $v$;
first means for deriving said first control voltage including means for providing the difference between said third control voltage $v$ and said fixed voltage $V_O$ and means for adding a predetermined portion of the difference between said third control voltage $v$ and said fixed voltage $V_O$ to said DC control voltage $v$; and
second means for deriving said second control voltage including means for providing the difference between a portion $Av$ of said third control voltage $v$ and said fixed voltage $AV_O$ and means for adding a predetermined portion of the difference between said portion $Av$ and said fixed voltage $AV_O$ to said DC control voltage $v$.

5. The apparatus recited in claim 4 wherein A is equal to 1.

6. The apparatus recited in claim 4 wherein said first amplifying means is included in a luminance channel of a televeision signal processing system and said second amplifying means is included in a chrominance channel of said television signal processing system.

7. The apparatus recited in claim 6 wherein means for developing said third control voltage includes means responsive to ambient light.

8. The apparatus recited in claim 4 wherein said first means includes first voltage divider means coupled between said fixed voltage $V_O$ and said third DC control voltage $v$; and wherein said second means includes second voltage divider means coupled between said fixed voltage $AV_O$ and said portion $Av$.

9. The apparatus recited in claim 8 wherein said first voltage divider means includes a first potentiometer, said first potentiometer having a wiper coupled to said first amplifying means; and wherein said second voltage divider means includes a second potentiometer, said second potentiometer having a wiper coupled to said amplifying means.

10. The apparatus recited in claim 4 wherein said second gain versus DC control voltage characteristic includes a region between said voltage $AV_O$ and a voltage $V_B$ where the gain is greater than 0, said voltage $V_B$ being substantially equal to the voltage at which said second amplifying means has a gain substantially equal to 0; and wherein said second source of fixed voltage includes means for coupling said voltage $V_B$ to said second amplifying means.

11. The apparatus recited in claim 10 wherein said second source of said voltage $AV_O$ includes a third source of fixed voltage $V_B$; potentiometer means coupled between said third source of fixed voltage $V_B$ and said means for developing said third DC control voltage; and means coupled to said potentiometer means for developing said voltage $AV_O$ at a point along said potentiometer means; said potentiometer means including a wiper coupled to said second amplifier means, said wiper being adjustable to couple a DC voltage $V_{FB}$ and said third control voltage to said second amplifying means.

* * * * *

UNITED STATES PATENT OFFICE
CERTIFICATE OF CORRECTION

PATENT NO. : 3,961,361

DATED : June 1, 1976

INVENTOR(S) : J. Avins and B. J. Yorkanis

It is certified that error appears in the above-identified patent and that said Letters Patent are hereby corrected as shown below:

Column 4, line 67, "transister" should read -- transistor --.
Column 8, line 62, "fled" should read -- filed --.
Column 10, line 65, the portion reading "gain control voltage" should read -- gain versus control voltage --. Column 12, line 41, the portion reading "voltage $V_{FB}$ and said" should read -- voltage between $V_B$ and said --.

Signed and Sealed this

Fourteenth Day of September 1976

[SEAL]

Attest:

RUTH C. MASON
Attesting Officer

C. MARSHALL DANN
Commissioner of Patents and Trademarks